US005588592A

United States Patent [19]

Wilson

[11] Patent Number: 5,588,592

[45] Date of Patent: Dec. 31, 1996

[54] METHOD AND APPARATUS FOR DETECTING THE ONSET OF FLOODING OF AN ULTRASONIC ATOMIZER

[75] Inventor: Robert F. Wilson, Vancouver, Canada

[73] Assignee: J. Eberspächer, Esslingen, Germany

[21] Appl. No.: 421,685

[22] Filed: Apr. 13, 1995

[30] Foreign Application Priority Data

Apr. 14, 1994 [DE] Germany .......................... 44 12 900.9

[51] Int. Cl.[6] ................................ H03B 5/30; B05B 1/08

[52] U.S. Cl. ............................................ 239/4; 239/102.2

[58] Field of Search .................................... 310/315, 323, 310/318, 316; 239/4, 102.2

[56] References Cited

U.S. PATENT DOCUMENTS 3,400,892 9/1968 Ensminger .............................. 239/4 X
4,275,363 6/1981 Mishiro et al. ..................... 310/316 X
4,469,974 9/1984 Speranza .......................... 239/102.2 X
4,642,581 2/1987 Erickson ............................. 239/102.2
4,689,515 8/1987 Benndorf et al. ................ 239/102.2 X
5,113,116 5/1992 Wilson .................................. 310/316

FOREIGN PATENT DOCUMENTS 0340470 7/1989 European Pat. Off. .

*Primary Examiner*—Kevin Weldon
*Attorney, Agent, or Firm*—McGlew and Tuttle

[57] ABSTRACT

Deleting the onset of flooding of a surface of an ultrasonic atomizer having an ultrasonic transducer with liquid to be atomized, in particular liquid fuel in connection with heaters, wherein the natural resonance frequency of the vibrating ultrasonic transducer is monitored for changes in frequency, and a flooding signal reporting a flooded condition is produced when a drop in resonance frequency over a previously detected resonance frequency is detected whose rate of decrease exceeds a set minimum threshold.

20 Claims, 3 Drawing Sheets

METHOD AND APPARATUS FOR DETECTING THE ONSET OF FLOODING OF AN ULTRASONIC ATOMIZER

FIELD OF THE INVENTION

The invention deals with ultrasonic generators used in conjunction with ultrasonic transducers employed as atomizers for liquids. More precisely, the invention deals with a method and apparatus for reliably detecting the condition where the atomizer has flooded and atomization has ceased, then clearing the atomizer of excess liquid, and reestablishing stable operation at resonance of the ultrasonic transducer.

BACKGROUND OF THE INVENTION

Numerous circuits which can be used to drive an ultrasonic transducer at useful power levels are known. These transducers are commonly made from a piezoelectric ceramic material which exhibits electromechanical resonance effects typical of many piezoelectric devices. When such piezoelectric devices are operated at one of their natural resonance frequencies, greatly improved electrical to mechanical power conversion can be accomplished, especially when the resulting vibrations are amplified using a suitable horn.

A known application of ultrasonic waves is in the atomization of liquids, particularly fuel oil. Specifically, a piezoelectric transducer is constructed so that fuel is allowed to flow in the form of a film over an atomizing surface of its horn. When the transducer is excited at one of its natural resonance modes with sufficient amplitude, the film of fuel oil that covers the horn is propelled from the surface in the form of a fog of fine droplets. Such an ultrasonic transducer has applications as a means of atomizing the fuel in an oil burning furnace, replacing, for example, the commonly used high pressure spray nozzle.

During atomization, and for any fixed system efficiency, there is a definite relationship between the viscosity and flow rate of the liquid and the minimum energy required to sustain atomization. Increasing energy is therefore required as the viscosity and/or the flow rate of the liquid increase. For any given energy or power level, excessive liquid viscosity or flow rate will cause the atomizer to flood and atomization will stop.

In the case of an ultrasonic atomizer used for atomizing fuel oil in an oil burner, the necessity to control the air to fuel ratio accurately for optimum operation ensures the fuel flow rate is well defined. However the viscosity of the fuel may vary widely as a result of operation over a wide environmental temperature range or the use of different fuel grades. It is therefore a real possibility that, at times, flooding of the atomizer may occur and so it is a necessary requirement of an ultrasonic generator used to drive such an atomizer that the generator is able to recognize when flooding of the atomizer has occurred and is further able to recover from this condition.

A known method used to sense the occurrence of flooding is to sense if the atomizer is no longer being driven at its chosen resonance frequency. The circuit required to sense this is generally just an extension of the circuit used to find and follow the resonance of the ultrasonic transducer. One type of ultrasonic generators find and follow the transducer resonance frequency by comparing the phase of the driving voltage with the phase of the resulting transducer current, and change the driving frequency until voltage and current are in phase. In these ultrasonic generators it is assumed the atomizer is flooded when the driving voltage and the resulting current fall out of phase. When this occurs, typically the generator is caused to begin sweeping the transducer over a defined range of frequencies until the resonant point is again found. For ultrasonic generators that use another method of resonance detection, namely sensing the frequency where the transducer current is at a maximum (for operation at series resonance) or a minimum (for operation at parallel resonance), then it is assumed that the atomizer is flooded when the current is no longer at the maximum or minimum value. Again, in this case, the generator typically begins sweeping the transducer over a range of frequencies in an attempt to locate the amplitude maximum or minimum and once again establish stable operation.

Another known method used for the sensing of atomizer flooding makes use of the reduction of the "Q" of the resonant system that occurs when the atomizer floods. With this method, when the value of the transducer current drops below a set threshold, the atomizer is assumed to be excessively damped and therefore flooded. Again, typically the generator begins frequency sweeping in an attempt to clear the atomizer of excess liquid and once again find the system resonance.

EP-A-0 340 470 discloses a further method for detecting flooding in an atomizer wherein the sharpness of resonance "Q" of the resonant system is observed by evaluating the edge steepness of the resonance curve. For this purpose the resonant circuit used in this known method does not lock to a resonance frequency but sweeps continuously the excitation frequency between two frequency limits on each side of the resonant frequency. If the resonance is pronounced enough the sweeping takes place between the two frequency limits of a narrow sweeping range. If weak resonance is detected the sweeping takes place between the two frequency limits of a wide frequency range. The steepness of the resonance curve is determined by feeding the voltage drop across a resistor through which the current of the driver output stage of the control circuit flows, to a comparator directly, on the one hand, and via a delay circuit, on the other hand. If the differences between non-delayed voltage and delayed voltage are below a certain threshold, it is assumed that the resonance curve is too weak and the wide sweeping range is switched to. If sweeping over the wide frequency range succeeds in propelling off non-atomized droplets, the edges of the resonance curve become steeper again and sweeping over the narrow frequency range can be resumed.

All the above methods of flooding detection, however, have proven to be unreliable in the detection of atomizer flooding. The main reason for this is their inability to reliably detect a common flooding mechanism.

To elaborate on this, with a typical ultrasonic atomizer the liquid to be atomized is caused to flow through a hole drilled axially along the length of the horn and emerges in the center of the horn face. From there, it flows in a film radially outward on the face of the horn. As it flows outward from the vibrational node at the horn center, it is subjected to increasing acceleration due to the ultrasonic vibrations which are at a maximum at the extreme periphery of the horn face. Normally, before the liquid reaches the periphery, it reaches a point where there is sufficient acceleration to drive it off the horn as a fog of atomized liquid. Thus, atomization primarily occurs in a relatively narrow ring-shaped zone on the atomizer face. The mean radius of this atomization zone relative to the radius of the horn for any given system power level and efficiency is mainly determined by the viscosity of the liquid and its flow rate.

In the case of the atomizer being used as a means of atomizing fuel in a furnace over an extended temperature range, the fuel flow rate as mentioned above is closely controlled, but the fuel viscosity may vary widely. Therefore it is not uncommon for the fuel viscosity at times to be so high that, for a particular power level, the fuel will flow all the way to the edge of the horn face and still will not receive enough energy to propel it from the horn and effect atomization.

When this condition occurs rapidly, the fuel immediately collects at the outer periphery of the horn and the rapid and very substantial increase in damping which immediately occurs causes the generator to lose control of the transducer frequency. This results in a complete loss in atomization with the fuel flowing from the atomizer face in much the same way as if the generator was simply switched off. In this case, the system is so highly damped and/or being driven so far off resonance that the electrical to mechanical power conversion at the transducer is negligible. This abrupt form of flooding is generally detectable by one of the above outlined methods.

A very much more difficult to detect mechanism of flooding occurs when the atomizer slowly begins to flood. Such a case occurs, for example, when the liquid volume slowly increases toward a set flow rate, the magnitude of which exceeds the flow rate for which atomization can be sustained under the conditions of viscosity and power level present. Since it is common to require the use of an impulse damper in the fuel delivery line of some oil burning furnaces for the purpose of smoothing the flow impulses caused by the action of the fuel pump, this gradual increase of fuel flow toward a steady state flow rate will occur in such a system each time the fuel flow is started. This action is due to the nature of the impulse damper which acts as a temporary storage reservoir, opposing any rapid changes in the fuel volume delivery rate. Initially, before full fuel output occurs, the flow rate will be lower than that which will cause flooding, under the present conditions of fuel viscosity and power level. As the flow rate increases, the atomization zone will move closer to the edge of the atomizer horn, and it may reach the very edge of the horn.

When this happens, the atomizer is on the verge of flooding. As the flow rate continues to slowly increase, atomization begins to break down as liquid fuel starts to collect around the rim of the horn. This fuel adds effective mass to the atomizer horn, which begins to cause the transducer's natural resonance frequency to decrease slightly. This is sensed by the generator, also called an excitation circuit here, whose output frequency correspondingly decreases to match the new resonance. This process continues with more fuel building up on the face of the horn and the resonance frequency decreasing until atomization is halted completely, and a hemispherically shaped mass of fuel, supported by standing waves, builds and is held on the entire face of the atomizer horn. Excess fuel supplied by the pump now simply runs off, leaving a very stable system, with a somewhat lower "Q" due to the fluid damping, operating at a new somewhat lower natural resonance frequency due to the added mass of the fluid. Even if the fuel flow is stopped, the mass of fuel will remain attached to the horn, and the system will continue to operate uselessly at its new resonance point for many minutes.

The atomizer is now completely flooded, no atomization is taking place, yet the methods of flooding detection mentioned above are unable to detect this because the system is indeed at resonance and the system "Q" is not unreasonably low. The only way to clear this large amount of excess fuel is to either switch off the system, or to quickly drive the frequency to a much different value, such as the minimum frequency in the range. In either case, this eliminates the standing waves that support the excess fuel, and it immediately falls away.

SUMMARY AND OBJECTS OF THE INVENTION

It is an object of the present invention to provide a method and a circuit arrangement for resolving the abovementioned problems, capable of reliably detecting the onset of flooding of an ultrasonic atomizer, on the one hand, and clearing excess liquid from a flooded ultrasonic atomizer and then reestablishing stable atomization at a selected one of the transducer resonance frequencies, on the other hand.

From the above, it is clearly a requirement for a practical ultrasonic generator to be able to detect the actual onset of flooding of an associated ultrasonic atomizer; detecting only that it is not operating at resonance cannot reliably determine that the atomizer is flooded.

This invention, in contrast to previous methods, monitors the frequency of the ultrasonic generator or excitation circuit as it drives the atomizer at resonance, and senses the small but relatively rapid decrease in natural resonance frequency caused by the accumulating mass of liquid, that has been discovered to always accompany actual flooding. Slow increases or decreases in resonance frequency, such as caused by temperature changes, are ignored as are rapid increases in frequency, such as may be caused when initially searching for the desired resonance frequency. Advantageously, the transducer may be replaced with another which, as is usually the case, does not have exactly the same resonance frequency as the replaced transducer, without affecting the circuit's ability to detect atomizer flooding. This is possible because in operation, absolute frequency is ignored, and only short term relative frequency is monitored.

Once flooding of the atomizer has been reliably detected by the above, the ultrasonic generator is forced to the minimum frequency in its range. This immediately breaks up the standing wave structure that may be holding a large excess of fuel to the face of the atomizer horn and allows it to fall away. At the same time, a signal from this flooding detection circuit is sent to a system controller which temporarily turns off the fuel pump and fuel flow begins to decrease as the fuel impulse damper discharges. The generator must now attempt to lock to the selected resonance frequency of the atomizer once again.

The commonly used method of frequency sweeping often claimed to aid in shaking off excess liquid and to assist in locating the resonance frequency need not be used in the invention. This method has little value in shaking off liquid since, when sweeping, only a tiny fraction of the total time is spent at the point of resonance. Most of the time is spent well off resonance, where almost no mechanical energy is produced. Occasionally, a last single drop may remain attached to the edge of the horn, and it is possible that the sweeping action may shake it loose. However this is of no real benefit since a single drop of liquid will not cause such excessive damping of the atomizer that the generator cannot find its resonance point. Sweeping is also not an efficient way to locate resonance since, while sweeping, the normal feedback loop which allows the generator or excitation circuit to converge on the resonance point is disconnected. If, while sweeping, a resonance point is detected, the sweep circuit must now be disconnected and the excitation circuit feedback loop then must be reconnected and stabilize very quickly or the circuit will sweep past and not detect the desired resonance point.

It has also been found that as long as substantial amounts of liquid flow over the surface of the atomizer horn, for example when the pump operates or the impulse damper is still discharging, especially at low temperature where fuel oil may be relatively viscous, it will not be possible for the generator to find the transducer resonance point under any circumstances. This is because insufficient vibrational energy is available to drive the heavy layer of fuel away from the atomizer horn due to the low "Q" caused by the damping effect of the fuel. The only possibility is to wait until the flow subsides sufficiently that the damping is reduced; before this, any amount of searching for resonance will be fruitless.

The use of frequency sweeping as a means of locating resonance has therefore been abandoned. Instead, an excitation circuit design is used which will automatically converge on the desired resonance point of the transducer without requiring sweeping, provided that the transducer is not excessively damped. The type of excitation circuit used to realize the invention is similar to that disclosed in U.S. Pat. No. 5,113,116 where a phase locked loop with very high loop gain is used to compare the phase of the transducer driving voltage with the phase of the resulting transducer current, and the result of the comparison being used to cause the frequency of the driving voltage to change until the driving voltage and resulting current are locked in phase. For practical reasons, the circuit has been optimized to converge on the transducer series resonance. Although voltage and current are also in phase at parallel resonance, the circuit cannot converge on this resonance point because the phase locked loop having been optimized to converge on series resonance will naturally be forced away from the parallel resonance point. In the event that resonance is not detected, or the atomizer floods, the driving frequency is reset to the lowest frequency in the desired range, and the phase locked loop is allowed to once again attempt to seek without other assistance the desired resonance point. This procedure is repeated until the flow of liquid through the atomizer has been reduced to the point where it is possible to detect and lock to the series resonance frequency.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DETAILED DESCRIPTION OF THE PREFERRED EMBODIMENT

Figure 1:
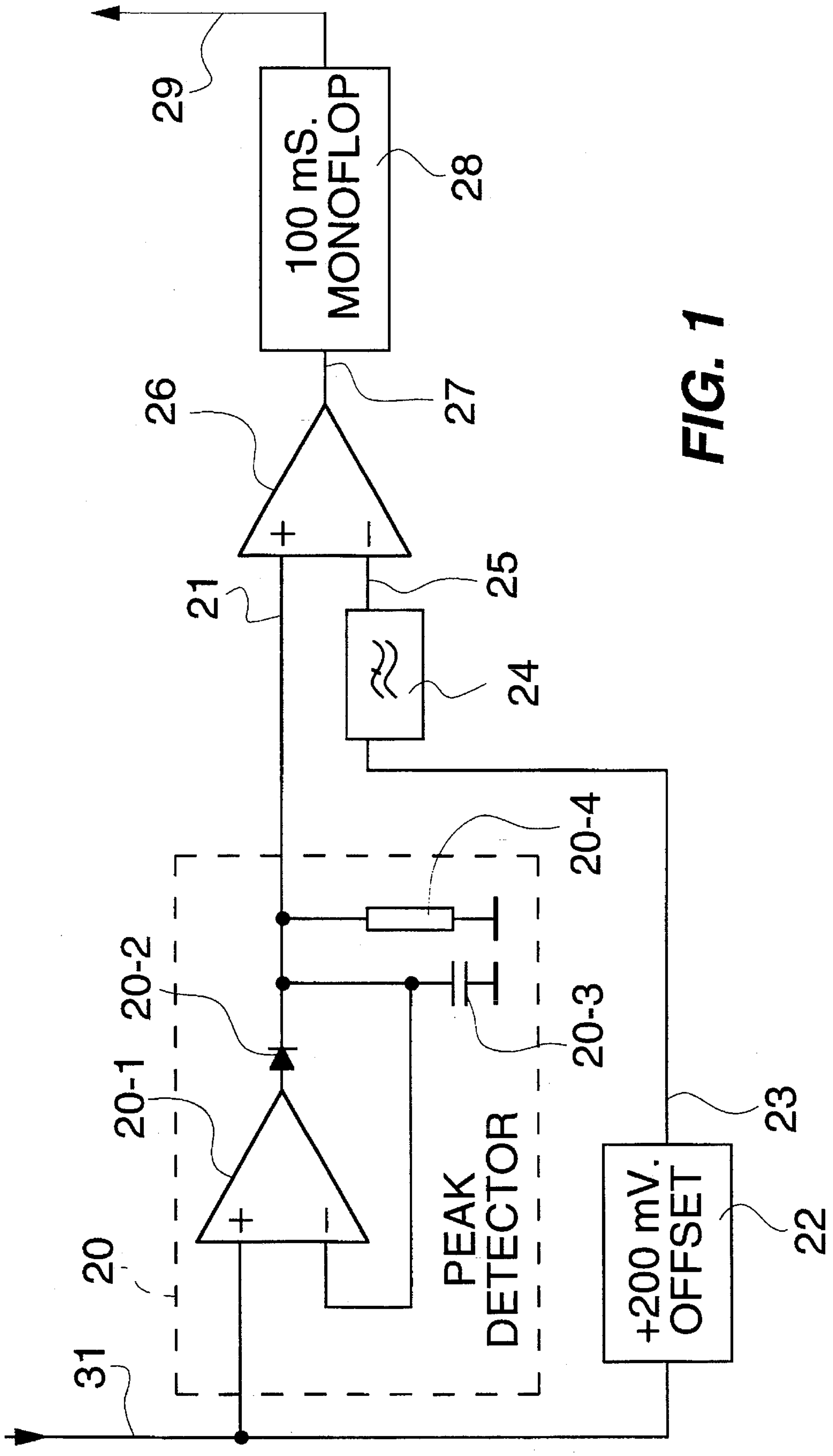
FIG. 1 shows a block diagram of a circuit arrangement used to detect the onset of flooding .of the ultrasonic transducer.

Referring to the drawings, FIG. 1 shows a block diagram of a circuit used to detect the onset of flooding of the ultrasonic transducer. This circuit is used in conjunction with and controls an ultrasonic generator or excitation circuit as will be shown later.

The circuit shown in FIG. 1 is also referred to here as a frequency drop detection circuit.

In the embodiment shown in FIG. 1, the frequency drop detection circuit includes peak detector 20 and offset adder circuit 22. Their inputs are connected jointly with feed line 31 to which a driving signal to be explained later is fed that corresponds to the frequency of the ultrasonic transducer. A non-inverting input of comparator 26 is connected with the output of peak detector 20. An inverting input of comparator 26 is connected via low-pass filter 24 with the output of offset adder circuit 22. Connected to the output of comparator 26 is a reset monoflop 28 that provides output pulses with a pulse length of preferably 100 milliseconds when it is triggered on the input side.

Peak detector 20 contains operational amplifier 20-1 whose non-inverting input is connected with feed line 31 and whose output is connected via diode 20-2 through a parallel circuit comprising capacitor 20-3 and resistor 20-4 with ground, on the one hand, and with the non-inverting input of comparator 26, on the other hand. The inverting input of operational amplifier 20-1 is connected with the juncture between capacitor 20-3 and diode 20-2.

Figure 2:
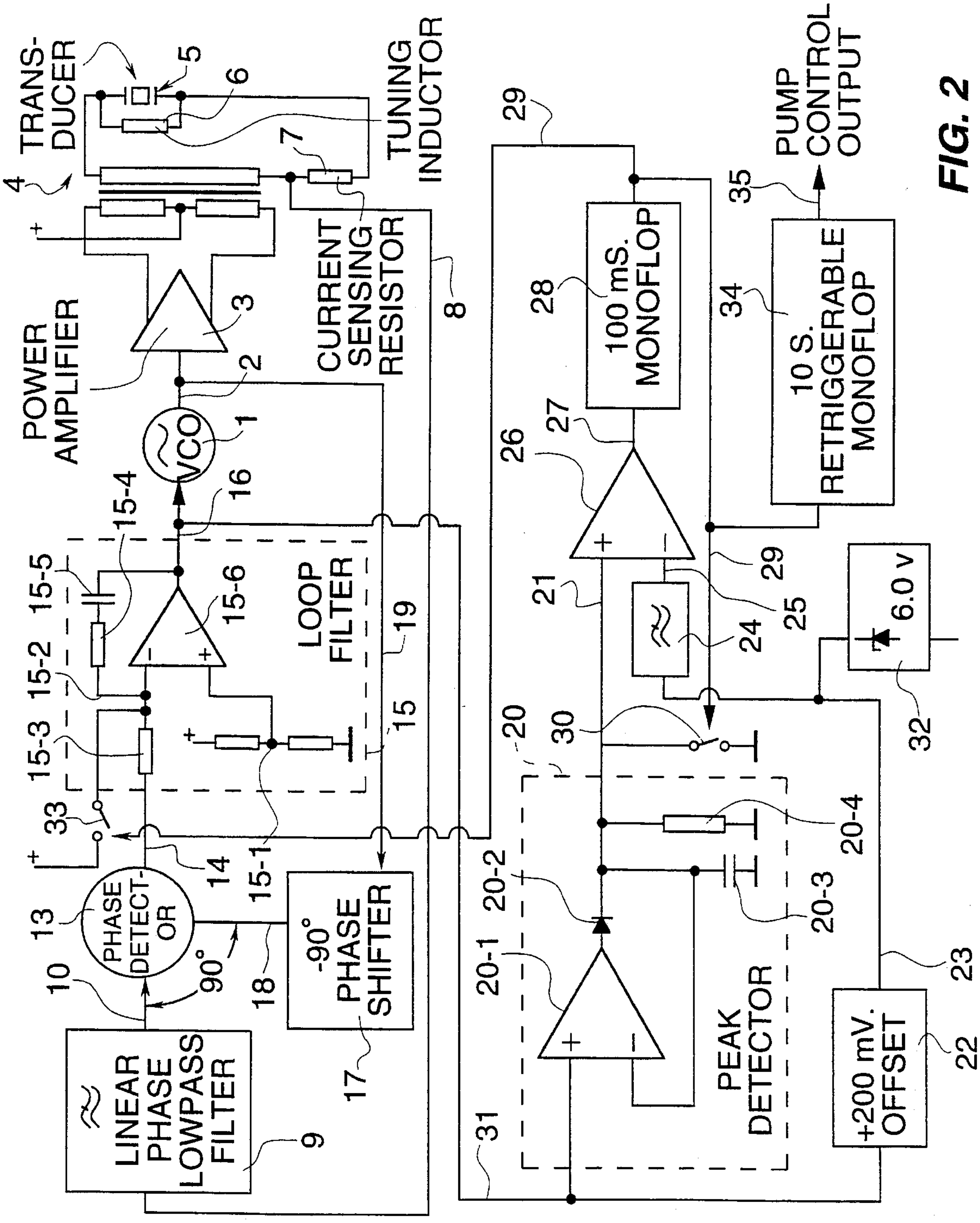
FIG. 2 shows a block diagram of the circuit shown in FIG. 1 in conjunction with an additional circuit arrangement for ending the flooding and a block diagram of a preferred excitation circuit.

An instantaneous value of the control voltage of voltage controlled oscillator (VCO) 1 from the excitation circuit shown in FIG. 2 is fed to feed line 31 of the frequency drop detection circuit. In the embodiment shown, this voltage is in the range of 1 to 6 volts and is proportional to the driving frequency of the excitation circuit. A voltage of 1 volt or any voltage below is equivalent to the minimum frequency, and a voltage of 6 volts equivalent to the maximum frequency of the selected operating frequency range of the excitation circuit. This voltage is fed to peak detection circuit 20. Its capacitor 20-3 acts as a storage capacitor that can be discharged via resistor 20-4. This circuit acts as a standard peak detector whose capacitor 20-2 stores the highest previous occurrence of the control voltage of VCO 1. Resistor 20-4 discharges storage capacitor 20-3 slowly so that slow decreases in the VCO control voltage, such as are caused by transducer temperature changes, will be followed but relatively rapid decreases in VCO control voltage will be stored on storage capacitor 20-3 and peak detector 20 cannot follow such rapid decreases. It has been found that a discharge time constant of about 40 seconds is optimum for best operation.

The VCO control voltage sample is also supplied to offset circuit 22 which adds a constant positive offset voltage to the VCO control voltage. This offset voltage represents the maximum short term frequency drop allowable before the atomizer is considered to be flooding. The value of the offset voltage depends on many factors, but a value of about 200 millivolt has been found to be optimum in the embodiment shown.

Low-pass filter 24 is provided to remove any noise present. The peak detector 20 output is naturally filtered by storage capacitor 20-2.

When the excitation circuit is driving the transducer at its resonance frequency, the driving frequency and hence the VCO control voltage on feed line 31 is relatively constant. The peak detector 20 output voltage is in this case identical to the VCO control voltage on feed line 31. Slow changes in frequency and hence the VCO control voltage on feed line 31 as may be caused by operating temperature changes, changes in atomizer load caused by fuel variations, buildup of contaminants on the atomizer, aging of the atomizer, and the like, are able to be followed by peak detector 20. This occurs because peak detector 20 will naturally follow VCO control voltage increases of any rate, and slow voltage decreases will be accommodated by the slow discharging action of discharging resistor 20-4. Under steady state operating conditions then, comparator 26 will be fed the output storage signal 21 of peak detector 20 at its non-inverting input and filtered signal 25 from the output of offset adder circuit 22 at its inverting input, which is 200 millivolt higher in value than the signal present at the non-inverting input of comparator 26. This results in output 27 of comparator 26 being in the "low" state. Comparator output 27 is fed to monoflop 28 whose output 29 is normally in the "low" state, but should it receive a brief positive-going transition at its input 27, its output 29 changes to the "high" state for a period of about 100 milliseconds. The purpose and cause of this short positive output pulse will be described shortly. For the present, it is clear that an atomizer driven at steady state will not produce an output from monoflop 28.

The above conditions change, however, as the atomizer begins to flood. At the onset of flooding, the added mass of liquid on the atomizer horn causes the resonance frequency to begin to decrease slightly. The excitation circuit is still locked to the resonant frequency of the atomizer and therefore adjusts the driving frequency to match the new, lower frequency of resonance. The VCO control voltage or driving signal on feed line 31, therefore, begins to drop since VCO 1 must be driven at a somewhat lower frequency. Output 21 of peak detector 20 does not initially follow the decrease in the VCO control voltage because discharge resistor 20-4 cannot quickly discharge storage capacitor 20-3 and because diode 20-2 prevents operational amplifier 20-1 from driving storage capacitor 20-4 to a lower voltage. Output 23 of offset adder circuit 22, on the other hand, does follow the VCO control voltage as it decreases, always maintaining a value of 200 millivolts above the instantaneous value of the VCO voltage.

A relatively rapid decrease in the frequency of resonance as atomizer flooding begins, equivalent to a decrease in the VCO control voltage of more than 200 millivolts, will result in signal 25 at the inverting input of comparator 26 being now lower in value than storage signal 21 at its non-inverting input. When this occurs, output 27 of comparator 26 changes to the "high" state and monoflop 28 is triggered, producing at its output 29 a 100 millisecond positive pulse. This pulse, which will always be produced as the atomizer begins to flood, will be used to initiate recovery from this flooded condition.

FIG. 2 shows the basic flooding detection circuit shown in FIG. 1, in combination with a block diagram of a preferred excitation circuit and an additional circuitry that clears a flooded atomizer of excess liquid and re-establishes stable operation at resonance.

The additions to the frequency drop detection circuit in FIG. 2 include switch 30 which is connected in parallel with discharging resistor 20-4 and is controlled by the output of monoflop 28, voltage clamp circuit 32 connected between output 23 of offset adder circuit 22 and ground, and second monoflop 34 used as a pump control means for control of an external liquid pump. Second monoflop 34 is triggered by the output pulse from first monoflop 28. It is a retriggerable monoflop that produces an output pulse of about 10 seconds.

Switch 30 is shown schematically as a mechanical switch in FIG. 2. However, it may take the form of a semiconductor switch such as a transistor. Voltage clamp circuit 32 acts similar to a 6,0 volt zener diode, preventing the output of offset adder circuit 22 from rising above 6,0 volts.

The embodiment shown in FIG. 2 uses a slightly modified version of the generator disclosed in FIG. 1 of U.S. Pat. No. 5,113,116. Modifications are that threshold amplifier 11 in FIG. 1 of that disclosure has been deleted, and switch 33 has been added.

For the structure and function of the ultrasonic generator with the excitation circuit having voltage controlled oscillator (VCO) 1, and a transducer circuit having ultrasonic transducer 5, reference is made to FIG. 1 of U.S. Pat. No. 5,113,116 and the corresponding parts of the description. For this reason the same reference numbers are used in the present FIG. 2 for the various components of the ultrasonic generator as in this U.S. patent.

In connection with the present invention the operation of the ultrasonic generator will be briefly explained as follows.

Electric excitation energy is fed by the excitation circuit to ultrasonic transducer 5 via transmitter 4 to produce ultrasonic vibrations. The excitation circuit includes voltage controlled oscillator 1 whose output signal is fed via power amplifier 3 to the primary side of transmitter 4. The oscillator voltage arising at output 2 of VCO 1 is fed via phase shifter 17 causing a phase shift of –90° to first input 18 of phase comparator 13. Its second input 10 is supplied via low-pass filter 9 having a linear phase response with a voltage that arises across current sensing resistor 7 and corresponds to the current flowing through transducer 5. Phase comparator 13 thus compares the phase of the driving voltage provided by the excitation circuit and the phase of the transducer current flowing through transducer 5. A signal corresponding to the phase difference arises at output 14 of phase comparator 13 and is fed to input 16 of VCO 1 through high-gain integrating loop filter 15. Assuming that the frequency of VCO 1 follows the resonance frequency of transducer 5, the VCO control voltage corresponds to the particular instantaneous frequency of transducer 5.

As already mentioned, threshold amplifier 11 in FIG. 1 of the stated U.S. patent is not contained in the embodiment shown in the present FIG. 2. In the excitation circuit shown in the U.S. patent its purpose is to block input 10 provided by low-pass filter 9 to phase comparator 13 when current through transducer 5 is very low due to the generator being operated close to parallel resonance. For the purposes of the present invention, this has been found to be unnecessary and undesirable because a temporary open loop situation is created as the generator frequency passes through the parallel resonance frequency of transducer 5. The generator circuit used for the present invention is configured so that it converges on the transducer series resonance frequency and therefore will be naturally forced away from the parallel resonance frequency. That is, for all frequencies below parallel resonance, the circuit will converge on the series resonance frequency above parallel resonance, the generator will be forced to the upper frequency limit of VCO 1.

As likewise already mentioned, the second modification over FIG. 1 of the stated U.S. patent is that a reset means with a switch 33 has been added as a means of connecting the inverting input of integrator 15-4, 15-5 and 15-6 of loop filter 15 to a source of positive voltage higher than is normally present at the non-inverting input of loop filter 15. Switch 33 is again shown as a mechanical switch for purpose of clarity, but can preferably take the form of a transistor, or other semiconductor switching device. It is under the control of output 29 of monoflop 28 such that for the duration of the 100 millisecond pulse of the monoflop 28, switch 33 is closed.

The purpose of this circuity feature is as follows. When a flooding condition is detected, the output pulse of monoflop 28 closes switch 33 momentarily which causes output 16 of integrating loop filter 15, which is also the VCO control voltage, to be driven to its minimum value. The pulse width of 100 milliseconds produced by monoflop 28 is chosen to be long enough to allow integrating loop filter 15 to be fully driven to its minimum output voltage. This results in the excitation circuit output frequency being quickly reset to the minimum frequency of the preset frequency range of VCO 1 in preparation for the excitation circuit to begin a new search for the resonance frequency of transducer 5.

The VCO control voltage of the excitation circuit is fed to feed line or input 31 of peak detector 20 and offset circuit 22 as described earlier. Since, when a flooded atomizer is detected, the VCO control voltage (at 16 and 31) is driven to a minimum in preparation for a new search for resonance, storage capacitor 20-3 of peak detector 20 in this case must be quickly discharged so peak detector output 21 again matches the VCO control voltage in order to allow output 27 of comparator 26 to return to a "low" state prior to a new resonance search. This is accomplished by switch 30 which is activated by output 29 of monoflop 28, and thus storage capacitor 20-3 is discharged quickly at the same time that the VCO control voltage, and hence the generator frequency, is being driven to its minimum value.

As mentioned earlier, if the generator frequency is above the parallel resonance point of transducer 5, the action of the phase locked loop will naturally force the generator to the upper frequency limit, and will "park" it permanently there. One must assume that the generator will from time to time encounter such a situation, and it must be able to recover from it. Such recovery is provided by voltage clamp circuit 32. Although the maximum control voltage able to be used by VCO 1 is, in this embodiment, 6,0 volts, the supply voltage to integrator 15-6 of loop filter 15 will be somewhat higher to ensure the integrator 15-6 output can encompass the full VCO control voltage range. Thus, under the condition described above, as the generator is parked at its upper frequency limit, the output of integrator 15-66, or the VCO control voltage, will attempt to rise to the upper power supply limit of integrator 15-6, which as stated will be somewhat higher than 6,0 volts. Output 21 of peak detector 20 will follow this rise, but the output of offset circuit 22 will be limited to a maximum of 6,0 volts by the action of voltage clamp 32. Since non-inverting input 21 of comparator 26 is now more positive than its inverting input 25, comparator 26 will then react by changing its output 27 to a "high" state, and monoflop 28 will be triggered, causing the generator output frequency to be reset to the minimum within its range, exactly as if a flooded atomizer had been detected.

It is important that during any search for the resonant frequency of the atomizer, the fuel flow must be stopped, since as mentioned previously the presence of excess liquid on the atomizer horn will inhibit resonance detection. To this end, retriggerable monoflop 34 is used that is triggered by output 29 of first monoflop 28. The pulse width of second monoflop 34 is dependent on a number of factors, but a pulse width of 10 seconds has been found to be optimum. The purpose of second monoflop 34 is to send a command via its output 35 to a fuel pump controller to temporarily stop the pump during a resonance search. When a flooding condition has been detected, and first monoflop 28 produces a 100 millisecond pulse for resetting the generator to its minimum value, second monoflop 34 is then also triggered, its output 35 causing the fuel pump to be stopped for 10 seconds. If, within this time, a resonance search again detects a flooded atomizer, then monoflop 34 is retriggered and this 10 second period is extended. This 10 second period ensures sufficient time for the system to stabilize after a successful resonance search, before the fuel flow is started again.

From the above, it can be seen that the flooding detection circuit can reliably detect the onset of atomizer flooding, it can reset the ultrasonic generator frequency to the lower frequency limit to allow the generator to begin a new search for resonance, it can then signal this condition to a fuel pump controller so the pump operation can be temporarily suspended, and should this search be unsuccessful and the generator be forced to the upper frequency limit, the flooding detection circuit will also detect this and again reset the generator frequency to the lower limit to begin another search.

Figure 3:
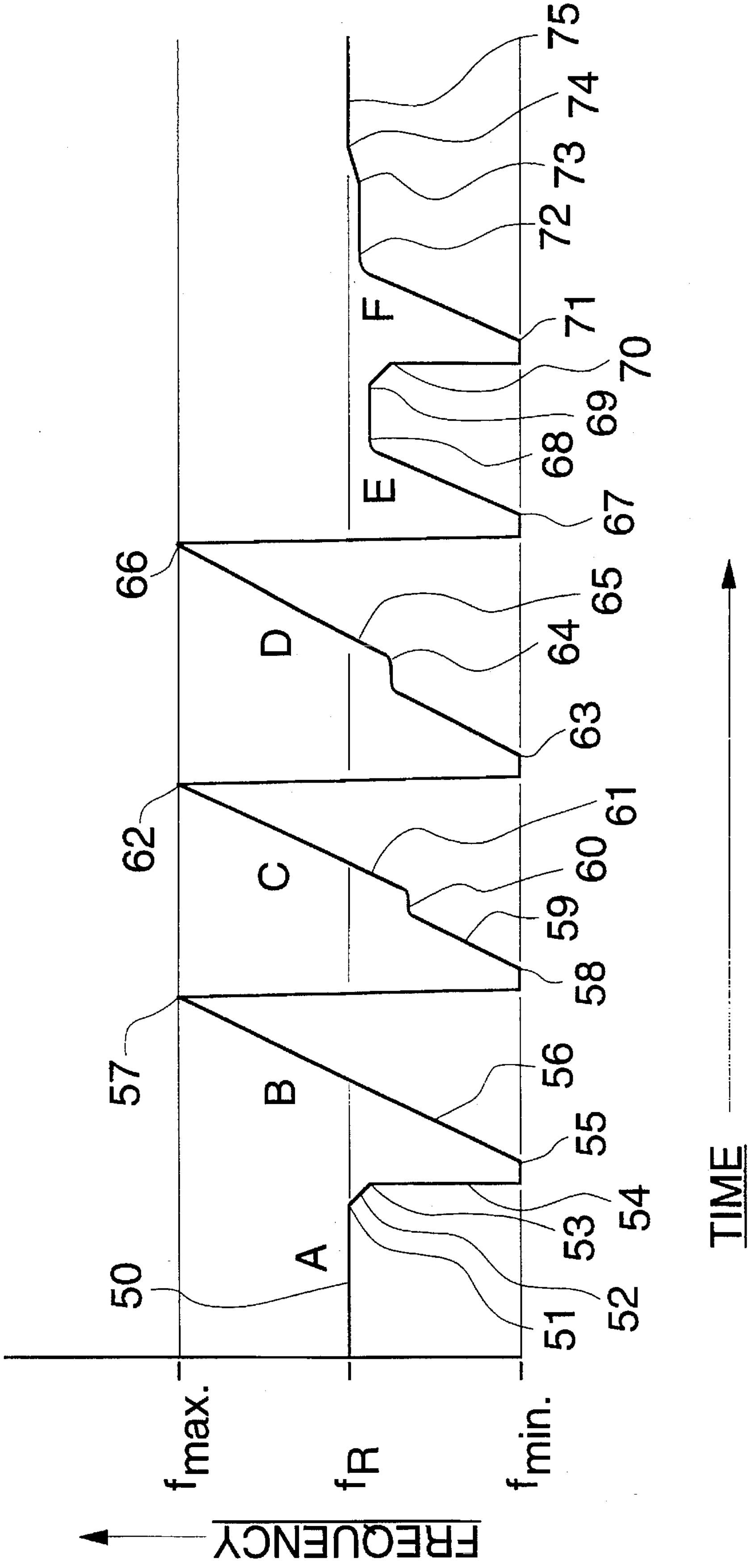
FIG. 3 shows a view of the ultrasonic transducer frequency as a function of time during various operating states of the transducer.

The actual operation of this system is illustrated in FIG. 3 which shows the ultrasonic generator frequency as a function of time beginning with a system in normal operation at resonance, which becomes flooded, then recovers from the flooded condition.

Section A of the curve shown in FIG. 3 shows the atomizer becoming flooded; section B shows the generator searching but failing to find any resonance point; sections C and D are similar to B, but as the fuel flow decreases, a heavily damped resonance is found momentarily; section E shows the generator stopping momentarily at a lower than normal resonance due to fuel loading, but the atomizer becomes further flooded with fuel, and the system resets to minimum frequency; and section F shows again a resonance being found but now with the fuel flow almost completely stopped, the system is capable of clearing the excess and returning to normal operation.

Looking at FIG. 3 in more detail, the curve begins with an ultrasonic generator driving its atomizer at resonance 50 and normal atomization taking place. At point 51, flooding begins and the decrease in resonant frequency is shown as the curve slopes downward 52. The resonant frequency soon decreases enough that the VCO control voltage has decreased by 200 millivolts at point 53, which triggers monoflop 28 to force the generator to its minimum frequency at 54, ensuring any excess fuel held to the atomizer horn falls away as previously explained. At this point, monoflop 34 is also triggered and sends a signal to the fuel pump controller shutting off the fuel. After the 100 millisecond duration of monoflop 28, VCO 1 is released from being held at its minimum frequency at 55 and allowed to begin searching for a resonant point. The generator frequency increases linearly at 56 under control of the generator's phase locked loop; no sweeping circuit is used or required. Due to the fact that the fuel flow is still relatively high as the fuel impulse damper discharges, the atomizer horn has far too much fuel flowing over it for any resonance to be detected. This condition also results in an atomizer voltage/current phase relationship that causes phase detector 13 of the excitation circuit to drive the VCO control voltage higher, and so the frequency rises linearly at a rate controlled only by the loop time constant, primarily determined by the R/C values of resistor 15-3 and capacitor 15-5. When the preset maximum frequency of the VCO frequency range is reached at 57, voltage clamp circuit 32 triggers comparator 26 to change state and in turn to trigger monoflop 28 which again resets the generator to the minimum frequency to attempt another search.

By time 58 when the next resonance search begins, the fuel flow has decreased somewhat. Initially the generator frequency rises linearly in area 59 as before, but pauses momentarily at 60 as a heavily damped and much lower than normal resonance frequency is found. The generator phase locked loop cannot lock to this unstable point, and is soon driven upward in frequency again in area 61 until the maximum point at 62 is reached and the generator again resets. Once again, the VCO is released at 63 and another upward frequency search begins. Now, with again less fuel flowing, the system pauses slightly longer at a somewhat higher frequency but still heavily loaded resonance point 64, but again cannot lock and is driven upward in frequency again until the generator is once again reset at 66. At each resetting of the generator frequency at 57, 62, and 66, monoflop 34 is retriggered, extending the duration of the fuel pump off-time.

Another upward search begins at 67 but now the fuel flow has been reduced sufficiently that the generator is able to lock at 68 although the atomizer is still partially flooded and the resonant frequency is still lower than normal. Because the atomizer is still excessively damped, full vibrational amplitude is not reached and no atomization takes place, therefore fuel begins to once again collect on the face of the atomizer horn at 69, held by standing waves in the liquid, until the VCO control voltage previously detected at 68 has been reduced by 200 millivolts at 70 causing monoflop 28 to be triggered, again resetting the generator frequency and extending the fuel pump off-time.

The final resonance search begins at 71 and now that the impulse damper is nearly empty, fuel flow is nearly stopped and a resonant point is found at 72 that is only slightly damped by excess fuel and only a little below the unflooded natural resonance frequency of the atomizer. Shortly after point 73, the atomizer is now able to drive off the small amount of remaining liquid and the unloaded resonance point is reached at 74. The system is now at resonance again in area 75 and 10 seconds after the last reset at 70, monoflop 34 will time out, allowing the fuel pump controller to start the pump, and atomization will begin again.

FIG. 3 shows a typical situation, but depending on many factors such as output power level, fuel type and viscosity, temperature, and flow rate, there may be more or less attempts by the generator before stable resonance is found. Until the fuel flow has decreased enough that it is possible for the system to detect the atomizer resonance under the above conditions, the multiple attempts at locating resonance are simply a way of passing time and testing periodically if resonance can yet be detected. Once the flow has decreased sufficiently, then section F of FIG. 3 will occur and the generator phase locked loop will lock automatically to the atomizer resonance.

I claim:

1. A method for detecting an onset of flooding of an atomizer, the method comprising the steps of:

operating the atomizer with liquid to be atomized;

monitoring a natural resonance frequency of the atomizer during said operating;

determining a rate of change of said natural resonance frequency;

comparing said rate of change of said natural resonance frequency with a threshold value;

generating a flooding signal indicating an onset of flooding when said rate of change of said natural resonance frequency exceeds said threshold value.

2. A method in accordance with claim 1, wherein:

said atomizer includes an ultrasonic transducer and is operated in an ultrasonic frequency range;

said flooding signal is generated when said rate of change of said natural resonance frequency is a decrease in said natural resonance frequency and a magnitude of said decrease exceeds said threshold value;

said determining of said rate of change of said natural resonance frequency is over a period of time shorter than said natural resonance frequency would change by said threshold value due to changes in temperature of the atomizer.

3. A method in accordance with claim 1, wherein:

said determining and comparing are performed by forming a driving signal corresponding to said natural resonance frequency, and by forming a storage signal in a peak detector which is increased to said driving signal whenever said driving signal is larger than said storage signal, said peak detector having a storage function that discharges said storage signal at a set slow speed, said driving signal and said storage signal are continuously compared with each other and when said driving signal is below said storage signal by a predetermined amount said threshold value is exceeded.

4. A method in accordance with claim 1, further comprising:

driving the atomizer into a resonance search when said flooding signal is generated.

5. A method in accordance with claim 1, further comprising;.

stopping liquid flow to the atomizer when said flooding signal is generated.

6. An atomizer comprising:

a transducer means for converting driving signals into vibrations;

excitation means for sending said driving signals to said transducer means, said excitation means generating said driving signals to correspond to a natural resonance frequency of said transducer means, said excitation means changing said driving signals to follow changes in said natural resonance frequency of said transducer means;

frequency detection means for monitoring said driving signals and for determining a rate of change of said frequency of said natural resonance frequency, said frequency detection means also generating a flooding signal when said rate of change of said frequency of said natural resonance frequency exceeds a threshold value.

7. An atomizer in accordance with claim 6, wherein:

said transducer means operates in an ultrasonic frequency range and has a surface to which liquid to be atomized is fed from a liquid supply;

said excitation means includes an electrical circuit;

said frequency detection means generates said flooding signal when a magnitude of a decrease in said rate of change exceeds said threshold value.

8. An atomizer in accordance with claim 6, further comprising reset means for switching said excitation means into a resonance search when said reset means receives said flooding signal.

9. An atomizer in accordance with claim 6, further comprising pump control means for blocking a supply of fluid to said transducer means when said pump control means receives said flooding signal.

10. An atomizer in accordance with claim 6, wherein:

said frequency detection means includes a peak detection circuit which creates a storage signal that is increased to said driving signal whenever said driving signal is larger than said storage signal, said peak detection circuit having a storage function that discharges said storage signal at a set slow speed, said frequency detection means also including an offset adder circuit for adding an offset to said driving signals, said frequency detection means also including a comparator circuit for comparing said storage signal with an output of said offset adder circuit, said frequency detection means generates said flooding signal when said output of said offset adder circuit is less than said storage signal.

11. An atomizer in accordance with claim 10, wherein:

said frequency detection circuit includes a reset monoflop connected to an output of said comparator circuit and generating said flooding signal for a set pulse length when said output of said offset adder circuit is less than said storage signal.

12. An atomizer in accordance with claim 11, wherein:

a retriggerable monoflop is connected to an output of said reset monoflop and interrupts a supply of fluid to said transducer means for a set length of time when said flooding signal occurs.

13. An atomizer in accordance with claim 11, wherein:

said set pulse length is approximately 100 milliseconds.

14. An atomizer in accordance with claim 12, wherein:

said set length of time is approximately 10 seconds from a last occurrence of said flooding signal.

15. An atomizer in accordance with claim 10, wherein:

said offset added to said driving signals is approximately 200 millivolts.

16. An atomizer in accordance with claim 10, wherein:

a low pas filter is connected between said offset adder circuit and said comparator for removing random noise.

17. An atomizer in accordance with claim 10, wherein:

a clamp circuit is connected to said output of said offset adder circuit to limit said output of said offset adder circuit to a set clamp voltage.

18. An atomizer in accordance with claim 17, wherein:

said clamp voltage is of a value to cause generation of said flooding signal when said driving signals correspond to an upper frequency limit of said transducer means.

19. An atomizer in accordance with claim 6, wherein:

said excitation means includes a phase lock loop with a phase comparator connected to a PLL low-pass filter generating said driving signals, and a voltage controlled oscillator receiving said driving signals.

20. A method in accordance with claim 19, further comprising:

a switch in said PLL low-pass filter which in a conductive state causes said PLL low-pass filter to generate a driving signal corresponding to a lowest frequency of said transducer means;

a switch in said frequency detection means which in a conductive state clears said storage signal, both of said switches being made conductive during a duration of said flooding signal.

* * * * *